United States Patent
Yeh et al.

(10) Patent No.: US 7,576,736 B2
(45) Date of Patent: Aug. 18, 2009

(54) PIXEL STRUCTURE FOR VERTICAL EMISSIVE- REFLECTIVE DISPLAY

(75) Inventors: Yung-Hui Yeh, Hsinchu (TW); Yu-Wu Wang, Hsinchu County (TW); Chih-Ming Lai, Changhua County (TW); Chi-Chang Liao, Tainan (TW); Hsing-Lung Wang, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 172 days.

(21) Appl. No.: 11/162,494

(22) Filed: Sep. 13, 2005

(65) Prior Publication Data

US 2007/0001956 A1 Jan. 4, 2007

(30) Foreign Application Priority Data

Jul. 1, 2005 (TW) .............................. 94122288 A

(51) Int. Cl.
*G09G 5/00* (2006.01)
(52) U.S. Cl. ......................................... 345/204; 349/48
(58) Field of Classification Search .................. 257/80, 257/84, 228, 229, 258, 292, E31.096, E31.102; 349/48, 50; 345/92, 204, 205
See application file for complete search history.

(56) References Cited

U.S. PATENT DOCUMENTS

| 6,011,529 | A | * | 1/2000 | Ikeda | ........................... 345/77 |
| 6,714,268 | B2 | | 3/2004 | Wang et al. | ................... 349/48 |
| 2002/0093472 | A1 | * | 7/2002 | Numao | ........................ 345/87 |
| 2003/0052869 | A1 | * | 3/2003 | Fujii et al. | ................... 345/204 |
| 2004/0061141 | A1 | * | 4/2004 | Kondoh | ....................... 257/202 |
| 2004/0109106 | A1 | | 6/2004 | Yang et al. | ..................... 349/69 |
| 2004/0164249 | A1 | | 8/2004 | Yung et al. | ..................... 257/40 |
| 2005/0001796 | A1 | * | 1/2005 | Liu | ............................... 345/87 |

FOREIGN PATENT DOCUMENTS

WO WO 2004/077137 A1 9/2004

* cited by examiner

*Primary Examiner*—Minh-Loan T Tran
*Assistant Examiner*—W. Wendy Kuo
(74) *Attorney, Agent, or Firm*—Jianq Chyun IP Office

(57) ABSTRACT

A pixel structure for a vertical emissive-reflective (emi-flective) display is provided. The pixel structure has a substrate, a self-light emitting pixel unit arranged on the substrate, and a reflective pixel unit arranged on the self-light emitting pixel unit. By using the vertical pixel structure, the aperture of the display can be increased, and the power consumption can also be decreased.

11 Claims, 4 Drawing Sheets

PIXEL STRUCTURE FOR VERTICAL EMISSIVE- REFLECTIVE DISPLAY

CROSS-REFERENCE TO RELATED APPLICATION

This application claims the priority benefit of Taiwan application serial no. 94122288, filed on Jul. 1, 2005. All disclosure of the Taiwan application is incorporated herein by reference.

BACKGROUND OF THE INVENTION

1. Field of Invention

The present invention relates a pixel structure for a display. In particular, the present invention relates to a pixel structure for an emissive-reflective (emi-flective) display.

2. Description of Related Art

FIG. 1 illustrates a pixel structure for a conventional emissive-reflective (emi-flective) display. The pixel structure includes a substrate 10, a self-light emitting pixel unit 14, a reflective pixel unit 12, and a transparent cover layer 16. The pixel structure is a horizontal type. Namely, the self-emitting pixel unit 14 and the reflective pixel unit 12 are disposed on the left and right sides of the same plane. As a result, the aperture of the display cannot be increased, and therefore, the image quality of the display is decreased.

When the conventional horizontal emi-flective display is used, its power consumption is higher because a backlight module is also required for half transmissive mode. At the same time, because of having a horizontal structure, the aperture of the display cannot be increased. Currently most displays having a combination of the emitting and reflective types primarily adopt a horizontal or coplanar half-reflective and half-transmissive structure, such as disclosures in U.S. Pat. No. 2,416,429 2A1 and World Patent No. 04077137A1. In addition, the self-light emitting element is used as a back light for the half reflective and half transmissive display. However, the aforementioned display has a problem that its aperture cannot be increased. Furthermore, U.S. Pat. No. 6,714,268 B2 discloses a horizontal display using a self-light emitting element as the back light for a half-reflective and half-transmissive type display. This structure also has drawbacks of low aperture and high power consumption.

Therefore, it is very important how to provide an effective pixel structure to increase the aperture and lower the power consumption.

SUMMARY OF THE INVENTION

An object of the present invention is to provide a pixel structure for a vertical emissive-reflective (emi-flective) display that can solve lower aperture and high power consumption of the conventional horizontal half-reflective and half-transmissive reflective display.

Another object of the present invention is to provide a pixel structure for a vertical emi-flective display, whose drive circuit can use a conventional LCD driver IC.

According to the above objects, the present invention provides a pixel structure for a vertical emi-flective display. The pixel structure comprises a first transistor, a second transistor, a first storage capacitor, a self-light emitting display unit, a third transistor, a second storage capacitor, and a reflective-type display unit. In the above pixel structure, the first transistor has a gate, a source, and a drain, in which the gate and the source of the first transistor are respectively coupled to a first scan line and a first data line. In addition, the second transistor has a gate, a source, and a drain, in which the gate of the second transistor is coupled to the source of the first transistor. One end of the first storage capacitor is coupled to the gate of the second transistor, and the other end is coupled to the source of the second transistor. Furthermore, the self-light emitting display unit has an anode, a self-light emitting layer (such as an organic light emitting layer) and a cathode, in which the anode is coupled to the drain of the second transistor. The third transistor has a gate, a source, and a drain, in which the gate and the source of the third transistor are respectively coupled to the second scan line and the second data line. One end of the second storage capacitor is coupled to the drain of the third transistor, and the other end is coupled to the common voltage. One end of the reflective-type display unit is coupled to the drain of the third transistor and the cathode of the self-light emitting display unit, and another end is coupled to the common voltage. Under the above configuration, when the pixel is operated in the self-light emitting display mode, the reflective-type display unit is turned off. Meanwhile, the self-light emitting display unit is turn off during the reflective display mode.

According to an embodiment of the present invention, in the pixel structure for the aforementioned vertical emi-flective display, the first, the second, and the third transistors can be any device capable of performing a switching function, such as a thin-film transistor. Furthermore, the thin-film transistor can be an organic thin-film transistor, a low-temperature polysilicon thin-film transistor, an amorphous thin-film transistor, a silicon-based thin-film transistor, a micro-silicon thin-film transistor ($\mu$-Si-TFT), a transparent thin-film transistor, or other types of transistors.

According to an embodiment of the present invention, in the pixel structure for the vertical emi-flective display, the other end of the first storage capacitor is coupled to a operation voltage or a ground voltage.

According to an embodiment of the present invention, in the pixel structure for the vertical emi-flective display, the self-light emitting display unit is, for example, an organic light emitting diode. The organic light emitting diode can be an inverted-type organic light emitting diode. Furthermore, the reflective display unit can be a liquid crystal display unit, for example.

According to an embodiment of the present invention, in the pixel structure for the vertical emi-flective display, the first and the second data lines can be further coupled to a data line through a switch. Furthermore, the first and the second scan lines can be further coupled to a scan line through a switch. The switch mentioned above can be constructed by a transistor.

In addition, the present invention further provides a pixel structure for a vertical emi-flective display. The pixel structure comprises a substrate, a self-light emitting pixel unit disposed on the substrate, a reflective pixel unit disposed on the self-light emitting pixel unit and a transparent cover layer disposed on the reflective pixel unit.

According to an embodiment of the present invention, in the pixel structure for the vertical emi-flective display, the substrate can be a flexible substrate. The substrate can be also a glass substrate, a plastic substrate, a silicon-based substrate, or a metal foil substrate.

The self-light emitting pixel unit can be an organic light emitting diode, for example. The organic light emitting diode can be an inverted-type organic light emitting diode. In addition, the reflective pixel unit can be constructed by liquid crystal, for example.

According to an embodiment of the present invention, in the pixel structure for the vertical emi-flective display, controlling the self-light emitting pixel unit and the reflective-type pixel unit to be turned on or off is through a switch element, such as a transistor. The transistor can be, for example, a thin-film transistor. Furthermore, the thin-film transistor can be an organic thin-film transistor, a low-temperature polysilicon thin-film transistor, an amorphous thin-film transistor, a silicon-based thin-film transistor, a micro-silicon thin-film transistor (μ-Si-TFT), a transparent thin-film transistor, or other types of transistors.

Based on the aforementioned vertical pixel structure, the issue regarding inability to increase the aperture of the display is can be solved. In addition, this combination of displays (for example, a combination of the organic light emitting diode and the liquid crystal) can provide a display with an optimal energy efficiency, and can be applied to an outdoor or indoor display.

It is to be understood that both the foregoing general description and the following detailed description are exemplary, and are intended to provide further explanation of the invention as claimed.

BRIEF DESCRIPTION OF THE DRAWINGS

While the specification concludes with claims particularly pointing out and distinctly claiming the subject matter which is regarded as the invention, the objects and features of the invention and further objects, features and advantages thereof will be better understood from the following description taken in connection with the accompanying drawings.

DESCRIPTION OF THE PREFERRED EMBODIMENTS

Technical features of the present invention will be further described in detail in accordance with the attached drawings. The concept of the present invention is to arrange a self-light emitting display unit and a reflective-type display unit vertically on a substrate.

Figure 2:
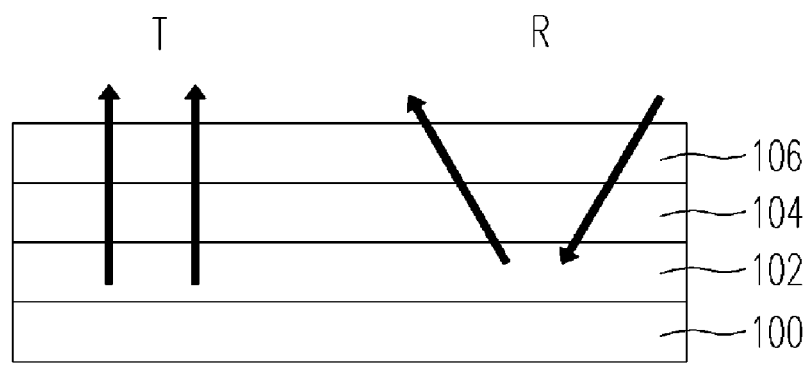
FIG. 2 is a schematic diagram of the pixel structure for the emissive-reflective (emi-flective) display according to the present invention.

FIG. 2 is a schematic diagram showing a pixel structure for a vertical emissive-reflective (emi-flective) display according to the present invention. A single pixel is used as an example for detail description, but for a complete panel, there are same pixel structures on the substrate. In addition, the term "emi-flective" mentioned in the present invention relates to a pixel structure having s self-light emitting display unit and a reflective-type display unit.

Figure 1:
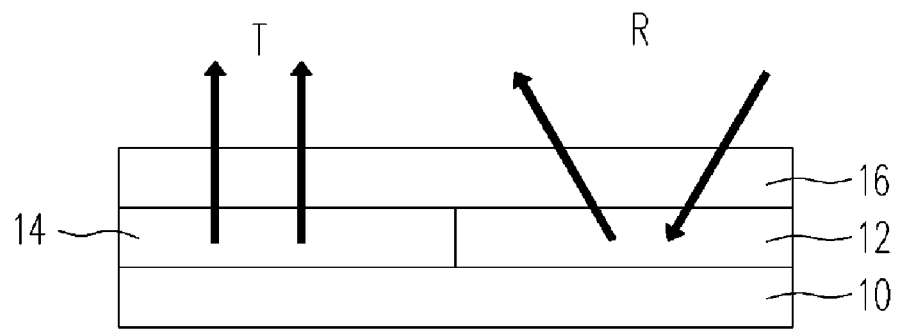
FIG. 1 is a schematic diagram illustrating a conventional pixel structure.

FIG. 1 merely illustrates a conceptual diagram showing the basic structure required for describing the present invention. The actual pixel structural diagram can further comprise other structures, but because the structures do not relate to the main subject of the present invention, they are omitted for the sake of simplicity. Those skilled in the art can add appropriate structures for implementing the present invention. Therefore, the simplified schematic diagram does not lack enablement of elements.

As shown in FIG. 2, the pixel for the emi-flective display of the present invention is also established on a substrate 100. The substrate 100 is, for example, a flexible substrate. Furthermore, the substrate 100 can be a glass, plastic, silicon-based substrate, or metal foil substrate.

A self-light emitting pixel unit 102 is disposed on the substrate 100. The reflective pixel unit 104 is disposed on the self-light emitting pixel unit 102. A transparent cover layer 106 is disposed on the reflective pixel unit 104. Therefore, the pixel structure is clearly a vertical structure. The vertical structure described here relates to a stacking manner of the self-light emitting pixel unit 102 and the reflective pixel unit 104, rather than the conventional sideway horizontal arrangement. By arranging the self-light emitting pixel unit 102 below the reflective pixel unit 104, no backlight module has to be set for the reflective pixel unit 104.

In the aforementioned structure, the self-light emitting pixel unit 102 can be an active light emitting element, such as an organic light emitting diode (OLED). Any type of organic emitting element is suitable for the vertical pixel structure according to the present invention, such as an inverted-type OLED, but is not limited to this type. In addition, the aforementioned reflective-type pixel unit is, for example, made from liquid crystal. In practice, type of liquid crystal required is not restricted.

For those skilled in the art, whether the self-light emitting pixel unit 102 and the reflective pixel unit 104 is lit or not, i.e., whether to write image data into the pixel is controlled through a switch circuit. According to the present invention, the switch circuit is not particularly limited to, and can be a transistor, for example. In addition, the transistor can be, for example, a thin-film transistor (TFT), which is widely used in the art. Generally, various types of thin-film transistors can be used for the present invention, and not particularly limited to any specific type. For example, an organic TFT (OTFT), a low-temperature polysilicon TFT, an amorphous TFT (a-TFT), a silicon-based TFT, a micro-silicon TFT (μ-Si-TFT), or a transparent TFT can be used.

In addition, in the aforementioned structure, an insulation layer (not shown) can further be disposed between the self-light emitting pixel unit 102 and the reflective pixel unit 104. The insulation layer is, for example, an insulation thin-film. Both the upper and the lower electrodes of the emitting pixel unit 102 are required to be patterned, and can independently control each pixel. Each self-light emitting pixel unit 102 is independently controlled by a pixel circuit, and each reflective pixel unit 104 is independently controlled by another pixel circuit.

As described above, each pixel layer contains only one particular display unit. Namely, at the same pixel layer, the panel area will be equally occupied by two different types of display units as the conventional horizontal structure. Since only one type (the self-light emitting pixel unit 102 or the reflective pixel unit 104) of display unit is formed on the entire panel area, one type of display units is operated at each display unit layer during the operation. Therefore, the pixel structure for the vertical emi-flective display of the present invention can provide a larger aperture. In other words, because each of the reflective region and the transmissive region of the above structure is on the same plane and are arranged up and down, the emitting area of the reflective region and the transmissive region can easily reach 50% or more. Therefore, the lower aperture ($\leq 30\%$) of the conventional horizontal pixel structure can be improved.

In addition, because the self-light emitting pixel unit is disposed below the reflective pixel unit, no additional backlight module is required. As a result, the conventional high power consumption can be solved.

To further describe the circuit structure of the present invention in more details, the following provides an illustration with reference to an equivalent circuit diagram.

Figure 3:
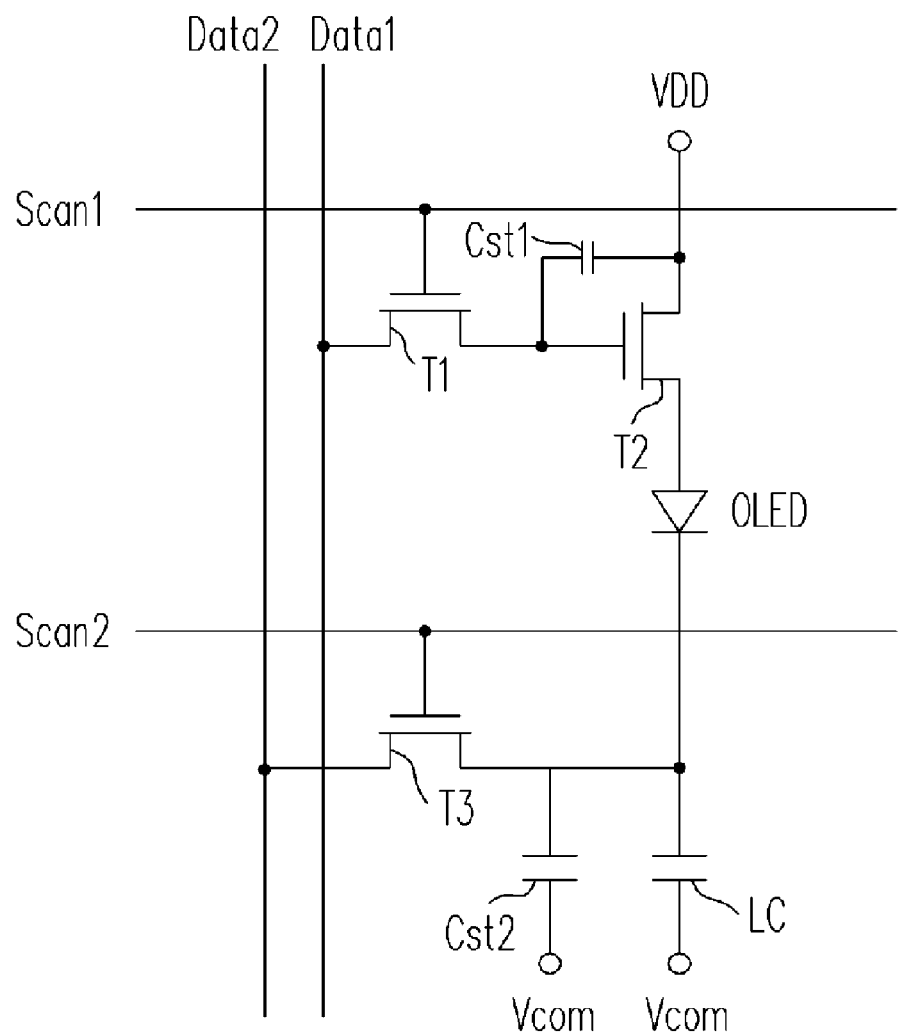
FIG. 3 is a schematic diagram illustrating the single pixel structure for the vertical emi-flective display according to an embodiment of the present invention.

FIG. 3 is a schematic diagram showing the vertical emi-reflective display according to an embodiment of the present invention. As shown in FIG. 3, the pixel structure for the vertical emi-flective display comprises a first transistor T1, a second transistor T2, a first storage capacitor Cst1, an self-light emitting display unit OLED, a third transistor T3, a second storage capacitor Cst2, and a reflective-type display unit LC. In addition, each pixel further includes two data lines Data1, Data2 and two scan lines Scan1, Scan2.

As shown in FIG. 3, the first transistor T1 has a gate, a source, and a drain, in which the gate and the source of the first transistor T1 are respectively coupled to the first scan line Scan1 and the first data line Data1. The second transistor T2 has a gate, a source, and a drain, in which the gate of the second transistor T2 is coupled to the drain of the first transistor T1. The first storage capacitor Cst1 has one end coupled to the gate of the second transistor T2 and another end coupled to the source of the second transistor T2. Another end of the first storage capacitor Cst1 and the source of the second transistor T2 are coupled together to the operation voltage (power source) VDD. The self-light emitting display unit OLED has an anode, a self-light emitting layer (such as an organic light emitting layer) and a cathode, in which the anode is coupled to the drain of the second transistor T2. The third transistor T3 has a gate, a source, and a drain, in which the gate and the source of the third transistor T3 are respectively coupled to the second scan line Scan2 and the second data line Data2. The second storage capacitor Cst2 has one end coupled to the drain of the third transistor T3 and another end coupled to the common voltage Vcom. The reflective-type display unit LC has one end coupled to the drain of the third transistor T3 and the cathode of the organic emitting unit OLED, and another end coupled to the common voltage Vcom.

Through the aforementioned connection, the pixel structure for a vertical configuration as illustrated in FIG. 2 can be achieved. In operation, the reflective-type display unit is turned off during the self light emitting display mode, and the self-light emitting display unit is turned off during the reflective-type display mode.

As described above, the first, second, and third transistors T1, T2, T3 illustrated in FIG. 3 are equivalent to the switch element of the pixel. The transistors T1, T2, T3 can be, for example, thin-film transistors. Similarly, the thin-film transistor can be an organic TFT, a low-temperature polysilicon TFT, an amorphous TFT, a silicon-based TFT, a micro-silicon TFT (μ-Si-TFT), or a transparent TFT.

In the aforementioned structure, the self-light emitting pixel unit 102 can be an active light emitting element, such as an organic light emitting diode (OLED). Any type of organic emitting element is suitable for the vertical pixel structure according to the present invention, such as an inverted-type OLED, but is not limited to this type. In addition, the aforementioned reflective-type pixel unit is, for example, constructed by liquid crystal or EPD. In practice, type of liquid crystal required is not restricted.

Operations for the aforementioned circuit is simply described as follows. When the self-light emitting pixel unit is in operation (ON state), the reflective-type pixel unit is turned off (OFF state). During the data writing period, the first scan line Scan1 and the second scan line Scan 2 are turned on, and image data is transmitted from the first data line Data1 through the first transistor T1, so as to turn on the second transistor T2 to lighten the self-light emitting pixel unit OLED. According to the written image data, the current flowing through the self-light emitting pixel unit OLED can be controlled by the second transistor T2. According to the current amount, the image data is thus displayed. At this time, the common voltage Vcom is provided to the second data line Data2 to ensure the LC is not in operation. In addition, during the data holding period, the first scan line Scan1 is turn off and the second scan line Scan 2 is turned on. At this time, no data is written to the first data line Data1, and the common voltage Vcom is still provided to the second data line Data2.

When the reflective-type pixel unit is in operation (ON state), the self-light emitting pixel unit is turned off (OFF state). During the data writing period, the first scan line Scan1 and the second scan line Scan2 are turned on, and an operation voltage VDD is applied to on the first data line Data1. At this time, the third transistor T3 is turned on because the second scan line Scan 2 is turned on. The image data is thus written through the second data line Data2 to the reflective-type pixel unit LC for displaying the image data. During the display period for the reflective-type pixel unit LC, the voltage across the reflective-type pixel unit LC is maintained by the second storage capacitor Cst2. During the data holding period, the first scan line Scan1 and the second scan line Scan 2 are turned off. At this time, no data is written to both the first data line Data1 and the second data line Data2.

Figure 4:
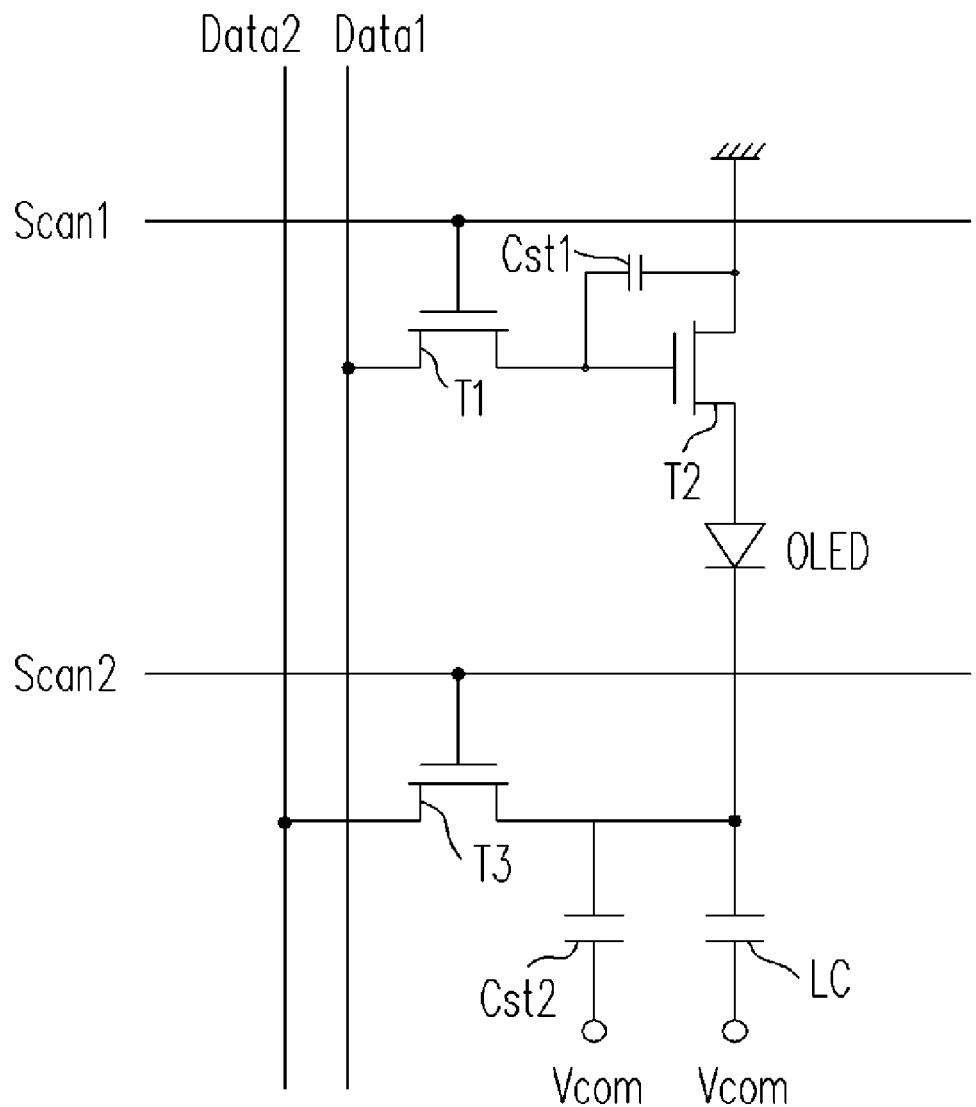
FIG. 4 is a schematic diagram illustrating an example of a variant of the pixel structure in FIG. 3.

FIG. 4 is a schematic diagram showing a variation example of the pixel structure in FIG. 3. The difference between FIG. 4 and FIG. 3 is in the connection manner for the self-light emitting display unit. In FIG. 3, the other end of the first storage capacitor Cst1 and the source of the second transistor T2 are coupled together to the operation voltage VDD. FIG. 4 shows that the other end of the first storage capacitor Cst1 and the source for the second transistor T2 are coupled to a ground voltage. In other words, the source of the second transistor T2 or the other end of the first storage capacitor Cst1 can be connected to the operation voltage VDD or the ground voltage according to actual conditions, for example, circuit structure, OLED types, and others.

Figure 5:
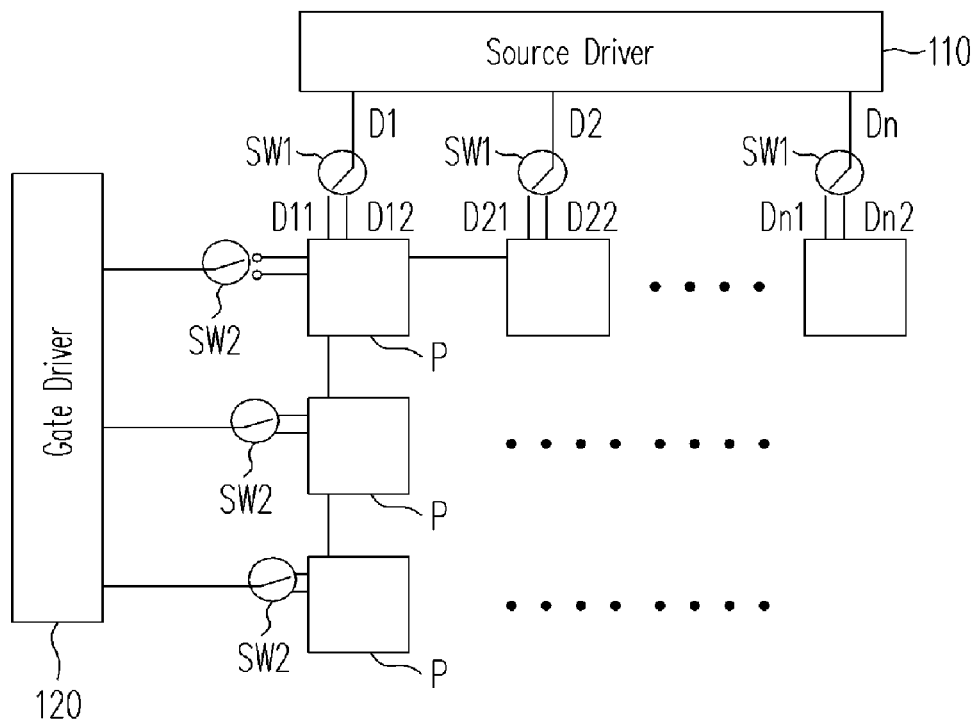
FIG. 5 is a schematic diagram illustrating the single pixel structure for the vertical emi-flective display according to an embodiment of the present invention.

FIG. 5 is a schematic diagram showing the pixel structure for a vertical emi-flective display according to another embodiment of the present invention. In general, data lines of the entire pixel array are connected to a source driver, and scan lines of the pixel array are connected to a gate driver. Typically, sources of transistors on the same column are connected through a data line, and gates of the transistors on the same row are connected through a scan line.

However, as viewed from the pixel structure in FIG. 3 or FIG. 4, the self-light emitting and reflective-type display units are controlled by independent circuits. Therefore, the self-light emitting and the reflective-type display units in the pixel structure respectively have their own data lines Data1, Data2 and scan lines Scan1, Scan 2. In other words, the sources of the transistors of pixels on the same column (the self-light emitting and the reflective-type display units) are respectively connected through two data lines, and the gates of the transistors of pixels on the same row (the self-light emitting and the reflective-type display units) are also respectively connected through two data lines. The conventional gate driver and source driver might not be applicable under this structure. A redesign of the gate driver and the source driver for the new pixel structure might be required, so that each column and row is connected by two lines.

For the sake of convenience, FIG. 5 illustrates a variant example for the pixel array. In FIG. 5, the first and the second data line D11, D12 for each pixel are further coupled to a data line D1 through a switch SW1, and the first and the second scan line are further coupled to a scan line through a switch SW2. The switches SW1, SW2 can be transistors, for example. Therefore, when driving the pixel array, the switch timing for the switches SW1, SW 2 can be controlled, so that only one of the data lines D11, D12 is connected to the data line D1 and only one of the scan lines is connected to the scan line for each particular display mode. In this way, the conventional drive circuit can be used by only adjusting the timing controller.

In summary, according to the vertical pixel structure for the present invention, the issue regarding inability to increase the aperture of the display can be solved. In addition, this combination of displays (for example, a combination of the organic light emitting diode and the liquid crystal) can provide a display with optimal energy efficiency, and can be applied to an outdoor or indoor display.

While the present invention has been described with a preferred embodiment, this description is not intended to limit our invention. Various modifications of the embodiment will be apparent to those skilled in the art. It is therefore contemplated that the appended claims will cover any such modifications or embodiments as fall within the true scope of the invention.

What is claimed is:

1. A pixel structure for a vertical emissive-reflective (emiflective) display, comprising:
   a first transistor, having a gate, a source, and a drain, wherein the gate and the source of the first transistor are respectively coupled to a first scan line and a first data line;
   a second transistor, having a gate, a source, and a drain, wherein the gate of the second transistor is coupled to the drain of the first transistor;
   a first storage capacitor, having one end coupled to the gate of the second transistor, and another end coupled to the source of the second transistor;
   a self-light emitting display unit, having an anode, a self-light emitting layer and a cathode, wherein the anode is coupled to the drain of the second transistor;
   a third transistor, having a gate, a source, and a drain, wherein the gate and the source of the third transistor are respectively coupled to a second scan line and a second data line;
   a second storage capacitor, having one end coupled, to the drain of the third transistor, and another end coupled to a common voltage; and
   a reflective-type display unit, having one end coupled to the drain of the third transistor and the cathode of the organic emitting unit, and another end coupled to the common voltage, wherein when operated in a self-light emitting display mode, the reflective-type display unit is turned off through the second scan line, and when operated in a reflective-type display mode, the self-light emitting display unit is turned off through the first scan line.

2. The pixel structure of claim 1, wherein the first, the second, and the third transistors are thin-film transistors.

3. The pixel structure of claim 2, wherein the thin-film transistor is selected from a group consisting of an organic thin-film transistor, a low-temperature polysilicon thin-film transistor, an amorphous thin-film transistor, a silicon-based thin-film transistor, a micro-silicon thin-film transistor (μ-Si-TFT) and a transparent thin-film transistor.

4. The pixel structure of claim 1, wherein the other end of the first storage capacitor is coupled to an operation voltage or a ground voltage.

5. The pixel structure of claim 1, wherein the self-light emitting display unit is an organic light emitting diode.

6. The pixel structure of claim 5, wherein the organic light emitting diode is an inverted-type organic light emitting diode.

7. The pixel structure of claim 1, wherein the reflective-type display unit is a liquid crystal display unit.

8. The pixel structure of claim 1, wherein the first data line and the second data lines are further coupled to a data line through a switch.

9. The pixel structure of claim 8, wherein the switch is a transistor.

10. The pixel structure of claim 1, wherein the first and the second scan lines are further coupled to a scan line through a switch.

11. The pixel structure of claim 10, wherein the switch is a transistor.

* * * * *